United States Patent [19]
Kowallek

[11] Patent Number: 4,603,267
[45] Date of Patent: Jul. 29, 1986

[54] LOW OFFSET SINGLE ENDED MOS COMPARATOR

[75] Inventor: Daniel E. Kowallek, Kokomo, Ind.

[73] Assignee: General Motors Corporation, Detroit, Mich.

[21] Appl. No.: 588,573

[22] Filed: Mar. 12, 1984

[51] Int. Cl.⁴ .............................................. H03K 5/24
[52] U.S. Cl. .............................. 307/362; 307/296 R; 307/350; 307/491
[58] Field of Search .................. 307/296 R, 350, 362, 307/491, 494, 497

[56] References Cited

U.S. PATENT DOCUMENTS 4,124,808 11/1978 Shieu et al. .................. 307/362
4,249,095 2/1981 Hsu .............................. 307/350

Primary Examiner—John Zazworsky
Attorney, Agent, or Firm—Albert F. Duke

[57] ABSTRACT

A MOS comparator which exhibits a low offset transfer characteristic in spite of parameter variations during production, includes a biasing circuit which causes the transfer characteristics of the comparator stages to track the transfer characteristics of the output amplifier to which it is connected. Offset voltage caused by stage mismatch is thereby eliminated even though the amplifier and comparator are configured differently.

3 Claims, 4 Drawing Figures

LOW OFFSET SINGLE ENDED MOS COMPARATOR

FIELD OF THE INVENTION

This invention relates to MOS comparators and, more particularly, to single ended MOS comparator including a biasing scheme which permits the comparator to exhibit a low offset voltage over temperature, voltage and process variations.

BACKGROUND OF THE INVENTION

A conventional single ended comparator is shown in FIG. 1. If the MOS transistors Q1,Q3 and Q5 are identical and transistors Q2,Q4 and Q6 are identical, then when Vin=Vref, V1=V2=V3. Stage 1 comprises a depletion device such as the depletion field effect transistor Q1, and an enhancement device such as the enhancement field effect transistor Q2. Stage 1 has its input shorted to its output forcing its bias point to assume the value V1. Since stages 2 and 3 are identical to that of stage 1 their transfer characteristics will also be identical to that of stage 1. Voltage V2 will, therefore, assume the value of V1 as depicted in FIG. 2, and voltage V3 will assume the value of V1.

The comparator output V3 is a low level signal and must be amplified to produce a usable output switching level. Merely cascading additional stages identical to stage 3 will not suffice for the output amplifier because the inherent negative feedback of the stage 3 configuration, due to the fixed bias on the gate of the depletion load transistor Q5, results in low stage gain and a limited output swing. A non-feedback amplifier configuration such as shown in FIG. 3 provides high gain and a full output swing but suffers from the fact that it is not biased identically to the bias of the comparator stages. While proper transistor sizing could produce a non-offset transfer characteristic for a particular set of conditions and parameters, offset will occur as parameters vary in production. What is needed is a biasing scheme which reconfigures the comparator to operate in a way which is electrically identical to the output amplifier even though it is connected differently.

SUMMARY OF THE INVENTION

With the foregoing in mind it is an object of the present invention to provide a MOS comparator which exhibits a low offset transfer characteristic in spite of parameter variations during production.

It is another object of the invention to provide a comparator including a biasing circuit which causes the comparator to operate in a way which is electrically identical to the output amplifier to which it is connected even though the amplifier and comparator are configured differently.

Other objects and advantages of the present invention will be more apparent from the following detailed description which should be read in conjunction with the drawings in which:

DESCRIPTION OF THE PREFERRED EMBODIMENT

Figure 1:
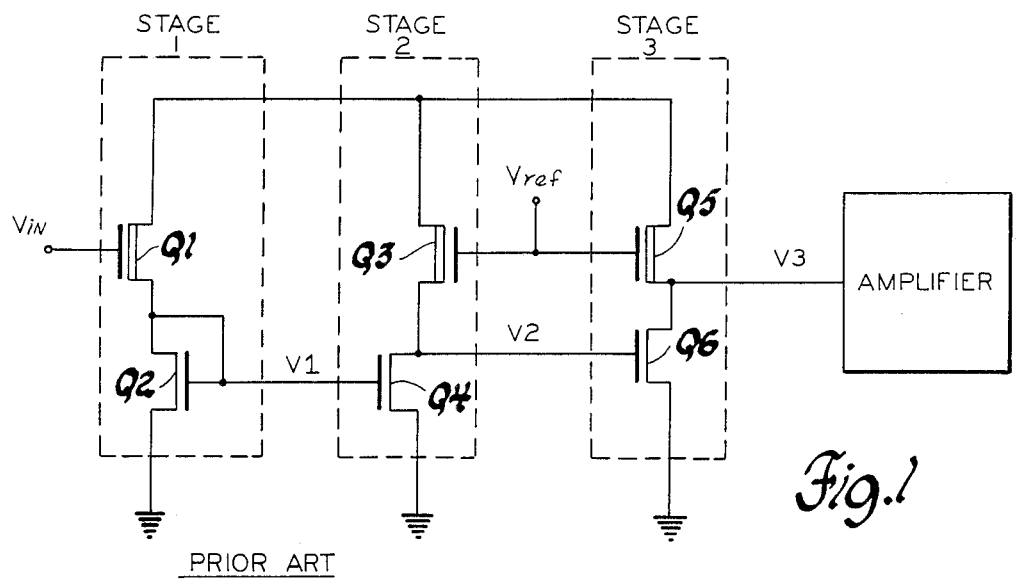
FIG. 1 is a schematic diagram of a prior art single ended MOS comparator.
Figure 2:
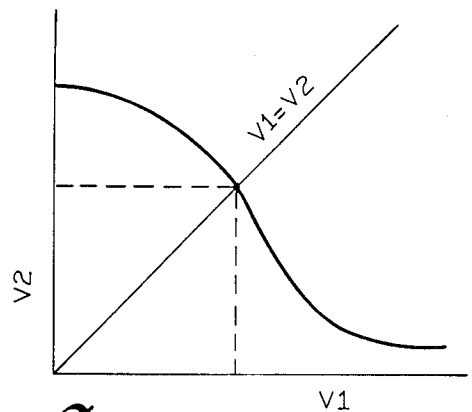
FIG. 2 shows an input-output characteristic of stage 2 of the comparator of FIG. 1.
Figure 3:
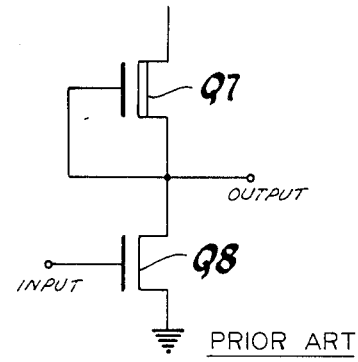
FIG. 3 shows a prior art non-feedback type MOS inverter amplifier.
Figure 4:
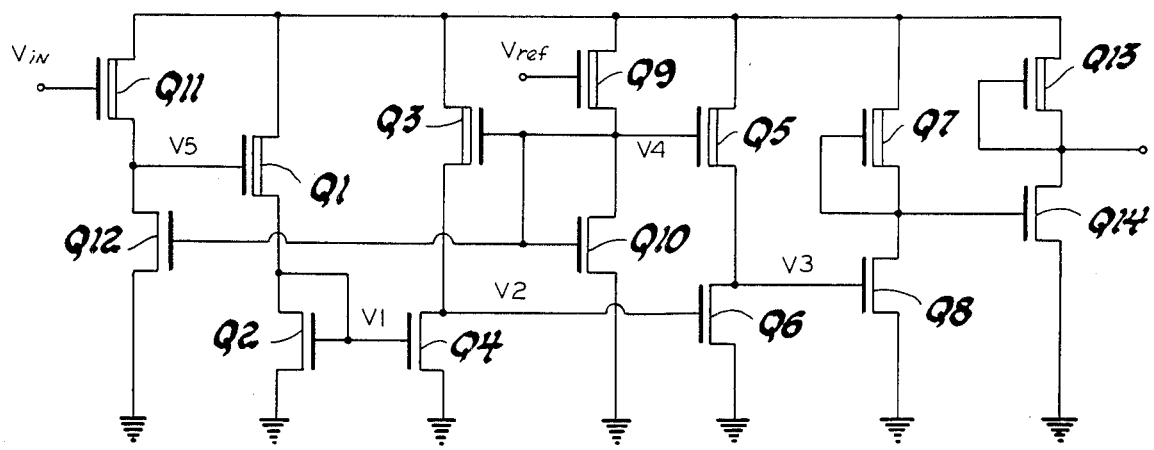
FIG. 4 is a schematic diagram of the comparator of the present invention.

Referring now to FIG. 4 of the drawings, it will be noted that the comparator of the present invention includes the comparator configuration of FIG. 1 comprising transistors Q1-Q6, connected with first and second output amplifiers comprising MOS transistors Q7,Q8 and Q13,Q14 respectively, as configured in FIG. 3.

Since the comparator output amplifier operates with the gate of depletion transistor Q7 shorted to its source (Vgs=0), it is desirable that the comparator load transistors Q1,Q3, and Q5 also operate with a zero gate to source voltage at the switching point. This condition must be achieved over all transistor parameters if zero comparator offset is to be maintained. This is accomplished by the bias circuit comprising MOS transistors Q9, Q10, Q11 and Q12. The transistors Q9 and Q10 form a voltage reference generator and level shifter. The transistor Q10 with the transistor Q12 form a current mirror. The transistor Q11 with the transistor Q12 form a level shifter.

The input voltage Vin is applied to the transistor Q11 while the reference voltage Vref which establishes the comparator switching point is applied to the gate of transistor Q9. The output voltage V4 of the reference generator is adjusted by the sizing of transistors Q9 and Q10 such that it is equal to the internal comparator voltages V1, V2, and V3. Q11 is made identical with Q9 so that when Vin=Vref, the level shifted input voltage V5 replicates the level shifted reference voltage V4. This voltage replication is achieved through the action of the current mirror formed by Q10 and Q12. Thus, V5=V4=V3=V2=V1 and, therefore, the comparator depletion load transistors Q1, Q3, Q5, Q7 and Q13 operate a Vgs=0 and can be identically sized. Similarly the transistors Q2,Q4,Q6,Q8 and Q14 can be sized identically. Thus, each stage is electrically identical and identically biased and as long as a zero gate to source voltage is maintained, there will be no comparator offset regardless of parameter variations.

It will be noted that the configuration of the reference circuit Q9,Q10 is similar to the configuration of stage 1 (Q1,Q2) of the comparator which establishes the internal comparator voltages. Due to this circuit similarity, the level shifted reference voltage V4 will track voltage V1 and the other internal comparator voltages extremely well. The gate to source voltage of Q1, Q3 and Q5 will, therefore, maintain at approximate zero volts despite parameter variations in production. Also, the level shifter Q11,Q12 is essentially lossless (i.e., a change in Vin causes an equal change in V5) due to the fact that Q12 operates as a constant current source. Further, by proper sizing of transistors Q9 and Q10, a wide range of values can be achieved for the level shifted reference voltage V4. Because of this capability, the entire circuit can be easily optimized for any desired comparator switch point.

The embodiments of the invention in which an exclusive property or privilege is claimed are defined as follows:

1. In an integrated MOS comparator circuit having first and second input nodes and an output node, the improvement comprising a biasing circuit comprising a first pair of series connected MOS devices, a second pair of series connected MOS devices, each of said pairs of devices being connected between a source of voltage and ground, one device of said first pair having a gate electrode adapted to be connected with an input voltage, one device of said second pair having a gate electrode adapted to be connected with a reference voltage, the junction between said first pair of devices connected to said first node, the gate electrodes of the other device in each of said pairs being connected to said second node and to a junction between the second pair of devices, said second pair of device being sized to produce a voltage at said second input node which is equal to the voltage at said output node when said input voltage equals said reference voltage.

2. In an integrated MOS comparator circuit having an input node, a reference node and an output node and comprising first, second and third stages, each including a depletion device and an enhancement device, the output node of the comparator circuit being connected to at least one inverter amplifier stage including a depletion device having source and gate coupled together to produce a zero source to gate differential voltage, the improvement comprising a biasing circuit means responsive to an input voltage $V_{in}$ and a reference voltage $V_{ref}$ for biasing said first, second and third stages so as to produce a zero source to gate differential voltage at each depletion device thereof when Vin equals $V_{ref}$.

3. In an integrated MOS comparator circuit having first, second, third and fourth stages, each stage comprising a depletion device and an enhancement device connected in series between a source of voltage and ground, the gate electrode of the enhancement devices of said first and second stages being connected to a first node between the devices of the first stage, the gate electrode of the enhancement device of the third stage being connected to a second node between the devices of the second stage, the gate electrode of the depletion devices of the second and third stages connected together and providing a level shifted reference node, the gate electrode of the depletion device of the first stage providing a level shifted input node and the junction between the devices of the third stage providing an output node, the gate electrode of the enhancement device of the fourth stage connected to said output node, the depletion device of said fourth stage having its gate connected to its source to provide a zero gate to source differential, the improvement comprising a biasing circuit including fifth and sixth stages, each comprising a depletion device connected in series with an enhancement device, the gate electrode of the enhancement device of said fifth and sixth stages being connected to said level shifted reference node and to a third node between the depletion and enhancement devices of said fifth stage, the junction between the depletion and enhancement devices of said sixth stage being connected to said input node, the gate electrode of the depletion devices of said fifth and sixth stages adapted to be respectively connected to a reference voltage and to an input voltage, the depletion and enhancement devices of said fifth stage being sized to produce a voltage at said level shifted reference node which is equal to the voltage at said output node when said input voltage is equal to said reference voltage.

* * * * *